United States Patent [19]

Mullarkey

[11] Patent Number: 5,602,790
[45] Date of Patent: Feb. 11, 1997

[54] MEMORY DEVICE WITH MOS TRANSISTORS HAVING BODIES BIASED BY TEMPERATURE-COMPENSATED VOLTAGE

[75] Inventor: Patrick J. Mullarkey, Meridian, Id.

[73] Assignee: Micron Technology, Inc., Boise, Id.

[21] Appl. No.: 515,126

[22] Filed: Aug. 15, 1995

[51] Int. Cl.$^6$ .................................... H03K 19/0175
[52] U.S. Cl. ............... 365/211; 365/212; 365/189.09; 326/31; 326/32; 326/33; 326/34; 327/157; 327/540; 327/541; 257/368
[58] Field of Search ......................... 365/211, 212, 365/189.09; 326/31, 32, 33, 34; 327/157, 540, 541; 257/368

[56] References Cited

U.S. PATENT DOCUMENTS

| | | | |
|---|---|---|---|
| 5,063,304 | 11/1991 | Iyengar | 307/296.6 |
| 5,191,244 | 3/1993 | Runaldue et al. | 326/33 |
| 5,382,843 | 1/1995 | Gucyski | 326/32 |
| 5,396,114 | 3/1995 | Lee et al. | 327/535 |
| 5,488,247 | 1/1996 | Sakurai | 327/541 |
| 5,506,540 | 4/1996 | Sakurai et al. | 327/535 |
| 5,530,394 | 6/1996 | Blosfeld et al. | 327/540 |

OTHER PUBLICATIONS

Micron Semiconductor, Inc., Schematic of Circuit used in DRAMs since before Aug. 15, 1995. (single schematic, 2 pages).

*Primary Examiner*—Viet Q. Nguyen
*Attorney, Agent, or Firm*— Seed and Berry LLP

[57] ABSTRACT

A memory device includes a plurality of PMOS transistors and a voltage regulator circuit. Each transistor has a gate, a source region, a drain region, and a well containing the source and drain regions. Each transistor is characterized by a threshold voltage which is dependent on temperature and on a body-source bias voltage. Each transistor is also characterized by a sub-threshold current which is dependent on the transistor's threshold voltage. The voltage regulator circuit is operatively coupled to each well to provide the body-source bias voltage to each well. The voltage regulator circuit temperature-compensates the body-source bias voltage to maintain the threshold voltage of each transistor approximately constant despite changes in temperature. The memory device thus advantageously has a relatively constant stand-by current despite temperature variations.

18 Claims, 2 Drawing Sheets

5,602,790

MEMORY DEVICE WITH MOS TRANSISTORS HAVING BODIES BIASED BY TEMPERATURE-COMPENSATED VOLTAGE

FIELD OF THE INVENTION

This invention relates in general to memory devices, and in particular to memory devices having biased MOS transistor bodies.

BACKGROUND OF THE INVENTION

Modern memory devices such as dynamic random access memories (DRAMs) are often implemented with CMOS transistors. A common arrangement for one of these memory devices is to use NMOS transistors for memory cells in a memory array of the memory device and to use PMOS transistors for support circuitry in the periphery of the memory array.

It is well known that the magnitude of the threshold voltages $V_t$ of PMOS transistors can decrease by approximately 4 mV for every 1° C. rise in the operating temperature of the transistors. Thus, for example, the magnitude of the threshold voltage $V_t$ of a PMOS transistor used in a DRAM can decrease by approximately 0.28 V within a typical operating range of 0° C. to 70° C. It is also well known that PMOS transistors have sub-threshold currents $I_{Dst}$ which rise exponentially during operation as the magnitude of a gate-source voltage $V_{GS}$ rises toward the threshold voltage $V_t$. Thus, the sub-threshold current $I_{Dst}$ of a PMOS transistor can be larger at, for example, 70° C. than it is at 0° C. with the same gate-source voltage $V_{GS}$ being applied at 70° C. and at 0° C. because the magnitude of the threshold voltage $V_t$ is greater at 70° C. than it is at 0° C. As a result, since DRAM memory devices are characterized in a stand-by mode by a stand-by current which includes the sub-threshold currents $I_{Dst}$, DRAM memory devices using PMOS transistors can have an acceptable stand-by current at, for example, 0° C. and an excessive stand-by current at, for example, 70° C.

This problem of excessive stand-by current at higher temperatures is exacerbated by modern methods for improving the speed of PMOS transistors. One method involves shortening the length of the channel in order to decrease the gate capacitance to increase switching speed. Another method involves adding more boron to the channel and decreasing the arsenic in the wells in order to lower their junction capacitances and increase their switching speed. Unfortunately, both of these methods also decrease the magnitude of the threshold voltage $V_t$ of PMOS transistors and thereby increase their sub-threshold currents $I_{Dst}$.

Therefore, there is a need in the art for a memory device which has a relatively constant stand-by current despite temperature variations.

SUMMARY OF THE INVENTION

The present invention provides a memory device comprising at least one MOS transistor and a voltage regulator circuit. The transistor has a gate, a source region, a drain region, and a body containing the source and drain regions. The source and drain regions are one of either p-type or n-type, and the body is the other of either p-type or n-type. The transistor is characterized by a threshold voltage which is dependent on temperature and on a body-source bias voltage. Each transistor is also characterized by a sub-threshold current which is dependent on the transistor's threshold voltage. The voltage regulator circuit is operatively coupled to the body to provide the body-source bias voltage to the body. The voltage regulator circuit is constructed to temperature-compensate the body-source bias voltage to maintain the threshold voltage approximately constant despite changes in temperature.

In another embodiment, the present invention provides a method for operating at least one MOS transistor in a memory device. The method comprises: applying a body-source bias voltage between a body and a source region of the transistor; applying a stand-by drain-source voltage between a drain region and the source region of the transistor during a stand-by mode of the memory device; applying a stand-by gate-source voltage between a gate and the source region of the transistor during the stand-by mode of the memory device; and adjusting the body-source bias voltage to compensate for changes in the stand-by current of the transistor due to changes in temperature and to thereby maintain the stand-by current below a maximum amount.

The present invention thus advantageously provides a memory device which has a relatively constant stand-by current despite temperature variations because the body-source bias voltage applied to the MOS transistor of the memory device is temperature-compensated.

DETAILED DESCRIPTION OF THE INVENTION

Figure 1:
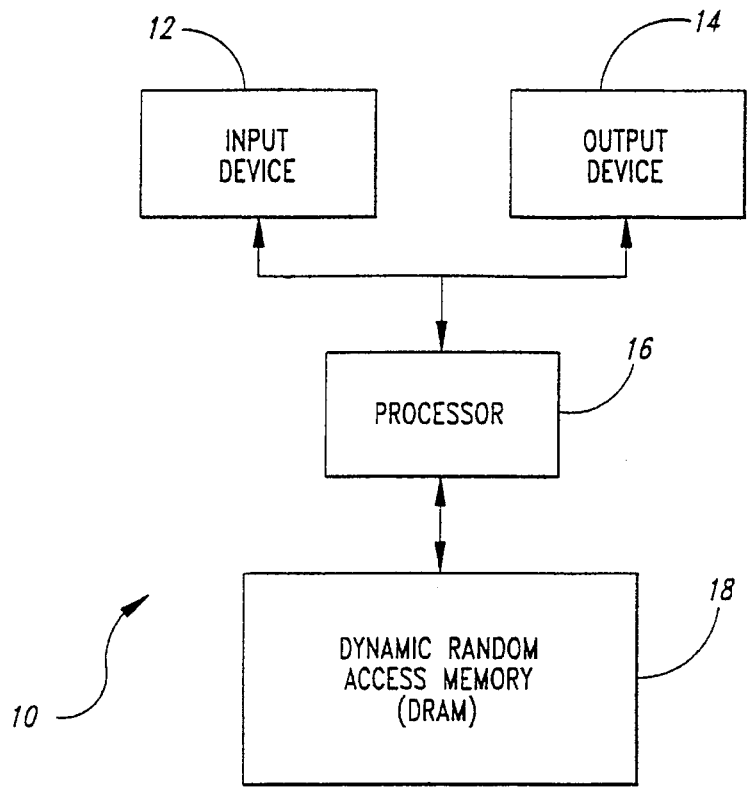
FIG. 1 is a block diagram of a preferred computer system according to the present invention.

As shown in FIG. 1, a preferred embodiment of the present invention comprises a computer system 10 including an input device 12 such as a keyboard and an output device 14 such as a computer monitor, both operatively coupled to a processor 16. The preferred computer system 10 also includes a memory device such as a dynamic random access memory (DRAM) 18 operatively coupled to the processor 16. Although the present invention will be described with respect to a DRAM, those having skill in the field of this invention will understand that the present invention is applicable to any memory device having MOS transistors.

Figure 2:
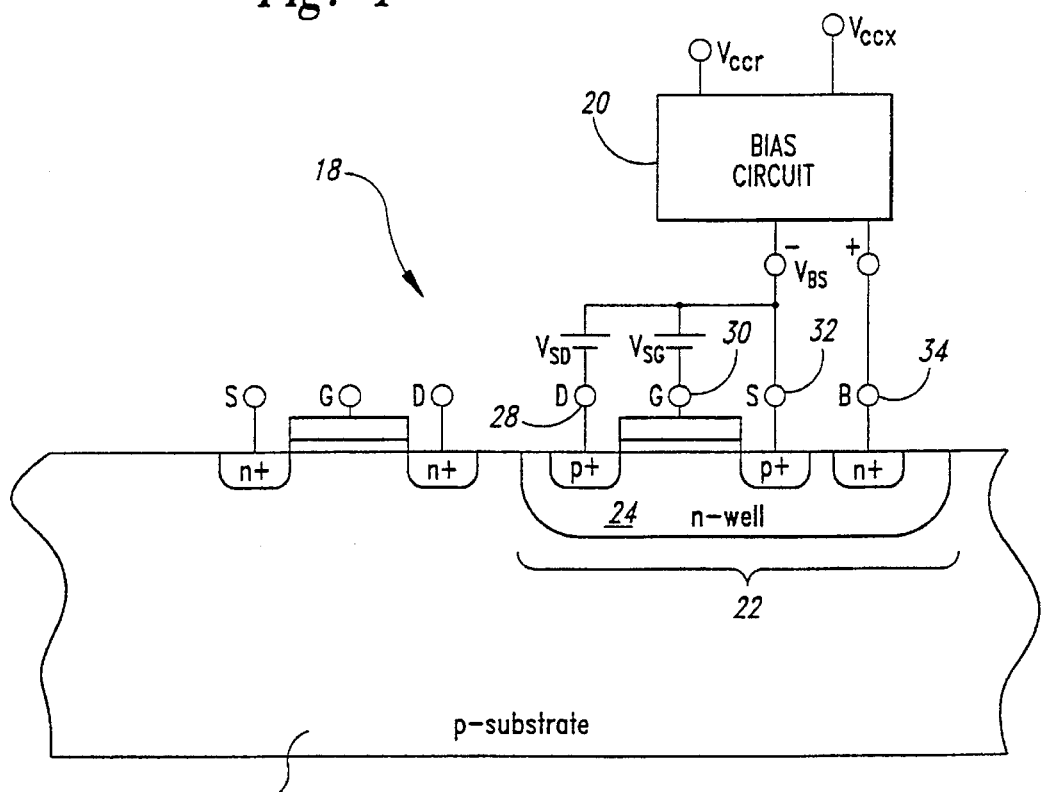
FIG. 2 is a side view of a MOS transistor and a block diagram of a bias circuit of a dynamic random access memory of the preferred computer system of FIG. 1.

The DRAM 18 of FIG. 1 is shown in more detail in FIG. 2. The DRAM 18 includes a bias circuit 20 operatively coupled to a plurality of MOS transistors, such as a PMOS transistor 22. The PMOS transistor 22 is constructed in the known manner with a body such as an n-well 24 implanted in a p-substrate 26. The PMOS transistor 22 includes a drain terminal 28, a gate terminal 30, a source terminal 32, and a body terminal 34. Although the present invention will be described with respect to the PMOS transistor 22 implemented in the n-well 24, it will be understood that the present invention is also applicable to PMOS transistors implemented in an n-substrate and to NMOS transistors implemented in a p-substrate such as the p-substrate 26.

The bias circuit 20 provides a body-source bias voltage $V_{BS}$ to the PMOS transistor 22 which is temperature-compensated so that a decrease in the magnitude of the threshold voltage $V_t$ of the PMOS transistor 22 due to a temperature increase is compensated for by an increase in the magnitude of the threshold voltage $V_t$ due to a change in the body-source bias voltage $V_{BS}$. The bias circuit 20 is described in more detail below with respect to FIGS. 3A, 3B and 4.

Figure 3A:
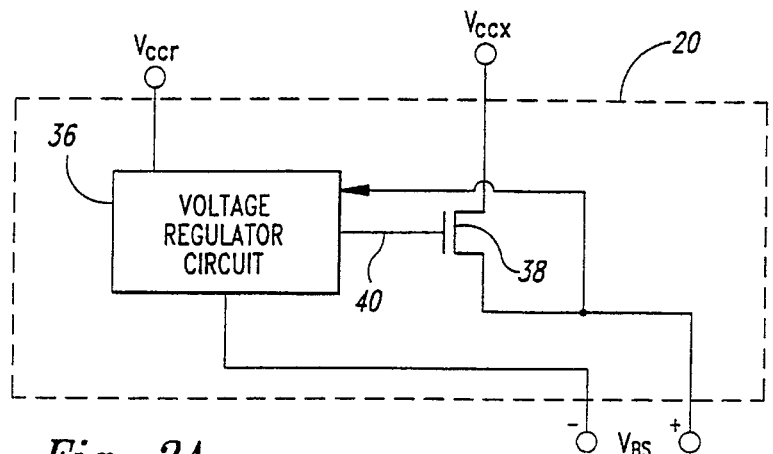
FIGS. 3A and 3B are block and schematic diagrams of the preferred bias circuit of FIG. 2.

One version of the bias circuit 20 of FIG. 2 is shown in more detail in FIG. 3A. The bias circuit 20 includes a temperature-compensated voltage regulator circuit 36 operatively coupled to a switching device, such as an NMOS transistor 38. The voltage regulator circuit 36 senses the level of the body-source bias voltage $V_{BS}$ being provided by the bias circuit 20 and, when necessary, provides a control signal 40 to the NMOS transistor 38 in order to turn the NMOS transistor 38 on and raise the body-source bias voltage $V_{BS}$.

Figure 3B:
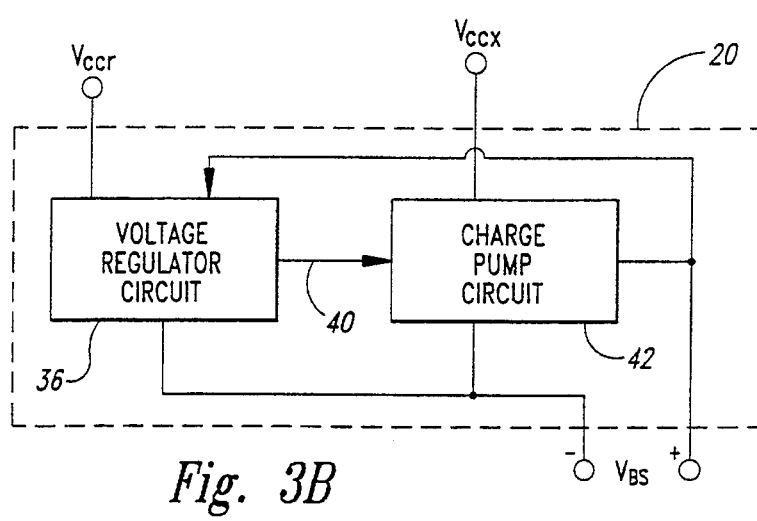

A preferred version of the bias circuit 20 of FIG. 2 is shown in FIG. 3B. The preferred bias circuit 20 includes the temperature-compensated voltage regulator circuit 36 operatively coupled to a conventional charge pump circuit 42. The voltage regulator circuit 36 senses the level of the body-source bias voltage $V_{BS}$ being provided by the bias circuit 20 and, when necessary, provides a control signal 40 to the charge pump circuit 42 directing the charge pump circuit 42 to increase the body-source bias voltage $V_{BS}$.

Figure 4:
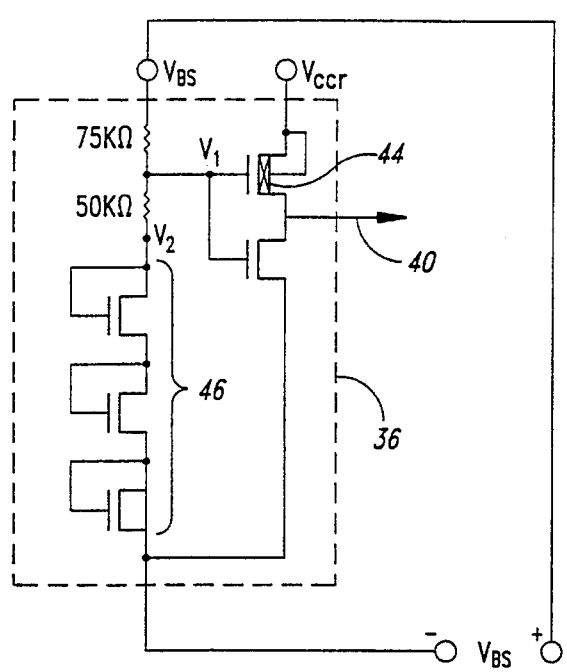
FIG. 4 is a schematic diagram of a voltage regulator circuit of FIGS. 3A and 3B.

The voltage regulator circuit 36 of FIGS. 3A and 3B is shown in more detail in FIG. 4. In operation, the voltage regulator circuit 36 provides the control signal 40 at a supply voltage $V_{ccr}$ when a gate voltage $V_1$ is less than the supply voltage $V_{ccr}$ minus the magnitude of the threshold voltage $V_t$ of a PMOS transistor 44.

If, for example, the supply voltage $V_{ccr}$ is 3.3 V, then at 25° C. the threshold voltage $V_t$ of the PMOS transistor 44 is approximately −0.5 V. Consequently, the gate voltage $V_1$ turns the PMOS transistor 44 on at voltages less than approximately 2.8 V. Since at 25° C. the threshold voltages $V_t$ of a plurality of NMOS transistors 46 are approximately 0.75 V each, a total voltage drop $V_2$ across the NMOS transistors 46 is approximately 2.25 V. Thus, the voltage regulator circuit 36 continues to provide the control signal 40 until the body-source voltage $V_{BS}$ reaches approximately 3.63 V, at which time the gate voltage $V_1$ exceeds 2.8 V and the control signal 40 is turned off.

If the temperature then increases to 85° C., the threshold voltage $V_t$ of the PMOS transistor 44 is approximately −0.3 V. Consequently, the gate voltage $V_1$ turns the PMOS transistor 44 on at voltages less than approximately 3.0 V. Since at 85° C. the threshold voltages $V_t$ of the NMOS transistors 46 are approximately 0.65 V each, the total voltage drop $V_2$ across the NMOS transistors 46 is approximately 1.95 V. Thus, the voltage regulator circuit 36 continues to provide the control signal 40 until the body-source voltage $V_{BS}$ reaches approximately 4.58 V, at which time the gate voltage $V_1$ exceeds 3.0 V and the control signal 40 is turned off.

In this example, the body-source voltage $V_{BS}$ reached at 25° C. (3.63 V) and at 85° C. (4.58 V) is designed to compensate for the change in the threshold voltage Vt of the PMOS transistor 22 (not shown) due to the change in temperature from 25° C. to 85° C. It will be understood that a wide variety of modifications can be made to the voltage regulator circuit 36 in order to provide the temperature compensation appropriate to a particular memory device.

The present invention thus advantageously provides a memory device which has a relatively constant stand-by current despite temperature variations because the body-source bias voltage applied to the MOS transistors of the memory device is temperature-compensated. Such a memory device is particularly advantageous in portable applications where a low stand-by current for a memory device is particularly desirable.

Although the present invention has been described with reference to a preferred embodiment, the invention is not limited to this preferred embodiment. Rather, the invention is limited only by the appended claims, which include within their scope all equivalent devices or methods which operate according to the principles of the invention as described.

I claim:

1. A memory device comprising:

at least one MOS transistor having a gate, a source region, a drain region, and a body containing the source and drain regions, the source and drain regions both being one of either p-type or n-type, the body being the other of either p-type or n-type, the transistor being characterized by a threshold voltage which is dependent on temperature and on a body-source bias voltage, the transistor also being characterized by a sub-threshold current which is dependent on the transistor's threshold voltage; and a voltage regulator circuit operatively coupled to the body for providing the body-source bias voltage to the body, the voltage regulator circuit being constructed to temperature-compensate the body-source bias voltage to maintain the threshold voltage approximately constant despite changes in temperature.

2. The memory device of claim 1 wherein the memory device is a dynamic random access memory.

3. The memory device of claim 1 wherein each MOS transistor is a PMOS transistor having p+-type source and drain regions contained in an n-type well which is disposed within a p-type substrate.

4. The memory device of claim 1 further comprising a switching device having an input terminal coupled to a supply voltage, an output terminal coupled to the body for providing the body-source bias voltage to the body, and a control terminal coupled to the voltage regulator circuit for receiving a control signal from the voltage regulator circuit which causes the switching device to couple the supply voltage at its input terminal to its output terminal, the voltage regulator circuit being constructed to provide the control signal when necessary to maintain the threshold voltage approximately constant despite changes in temperature.

5. The memory device of claim 1 further comprising a charge pump having an input terminal coupled to a supply voltage, an output terminal coupled to the body for providing the body-source bias voltage to the body, and a control terminal coupled to the voltage regulator circuit for receiving a control signal from the voltage regulator circuit which causes the switching device to couple the supply voltage at its input terminal to its output terminal, the voltage regulator circuit being constructed to provide the control signal when necessary to maintain the threshold voltage of each transistor approximately constant despite changes in temperature.

6. A computer system comprising:

an input device;

an output device;

a processor operatively coupled to the input and output devices; and a memory device operatively coupled to the processor, the memory device comprising:

at least one MOS transistor having a gate, a source region, a drain region, and a body containing the source and drain regions, the source and drain regions being one of either p-type or n-type, the body being the other of either p-type or n-type, the transistor being characterized by a threshold voltage which is dependent on temperature and on a body-source bias voltage, the transistor also being characterized by a sub-threshold current which is dependent on the transistor's threshold voltage; and a voltage regulator circuit operatively coupled to the body for providing the body-source bias voltage to the body, the voltage regulator circuit being constructed to temperature-compensate the body-source bias voltage to maintain the threshold voltage approximately constant despite changes in temperature.

7. The computer system of claim 6 wherein the memory device is a dynamic random access memory.

8. The computer system of claim 6 wherein the MOS transistor is a PMOS transistor having p+-type source and drain regions contained in an n-type well which is disposed within a p-type substrate.

9. The computer system of claim 6 wherein the memory device further comprises a switching device having an input terminal coupled to a supply voltage, an output terminal coupled to the body for providing the body-source bias voltage to the body, and a control terminal coupled to the voltage regulator circuit for receiving a control signal from the voltage regulator circuit which causes the switching device to couple the supply voltage at its input terminal to its output terminal, the voltage regulator circuit being constructed to provide the control signal when necessary to maintain the threshold voltage approximately constant despite changes in temperature.

10. The computer system of claim 6 wherein the memory device further comprises a charge pump having an input terminal coupled to a supply voltage, an output terminal coupled to the body for providing the body-source bias voltage to the body, and a control terminal coupled to the voltage regulator circuit for receiving a control signal from the voltage regulator circuit which causes the switching device to couple the supply voltage at its input terminal to its output terminal, the voltage regulator circuit being constructed to provide the control signal when necessary to maintain the threshold voltage approximately constant despite changes in temperature.

11. A memory device comprising:

at least one MOS transistor having a gate, a source region, a drain region, and a body containing the source and drain regions, the source and drain regions being one of either p-type or n-type, the body being the other of either p-type or n-type, the transistor being characterized by a threshold voltage which is dependent on temperature and on a body-source bias voltage, the transistor also being characterized by a sub-threshold current which is dependent on the transistor's threshold voltage; and voltage regulating means operatively coupled to the body for providing the body-source bias voltage to the body, the voltage regulating means being constructed to temperature-compensate the body-source bias voltage to maintain the threshold voltage approximately constant despite changes in temperature.

12. The memory device of claim 11 wherein the memory device is a dynamic random access memory.

13. The memory device of claim 11 wherein the MOS transistor is a PMOS transistor having p+-type source and drain regions contained in an n-type well which is disposed within a p-type substrate.

14. The memory device of claim 11 wherein the voltage regulating means is a voltage regulator circuit.

15. The memory device of claim 11 further comprising switching means having an input terminal coupled to a supply voltage, an output terminal coupled to the body for providing the body-source bias voltage to the body, and a control terminal coupled to the voltage regulating means tier receiving a control signal from the voltage regulating means which causes the switching means to couple the supply voltage at its input terminal to its output terminal, the voltage regulating means being constructed to provide the control signal when necessary to maintain the threshold voltage approximately constant despite changes in temperature.

16. The memory device of claim 15 wherein the switching means is a transistor.

17. The memory device of claim 11 further comprising charge pump means having an input terminal coupled to a supply voltage, an output terminal coupled to the body for providing the body-source bias voltage to the body, and a control terminal coupled to the voltage regulating means for receiving a control sisal from the voltage regulating means which causes the switching means to couple the supply voltage at its input terminal to its output terminal, the voltage regulating means being constructed to provide the control signal when necessary to maintain the threshold voltage approximately constant despite changes in temperature.

18. The memory device of claim 17 wherein the charge pump means is a charge pump circuit.

* * * * *

UNITED STATES PATENT AND TRADEMARK OFFICE
CERTIFICATE OF CORRECTION

PATENT NO.    :   5,602,790
DATED         :   February 11, 1997
INVENTOR(S)   :   Patrick J. Mullarkey It is certified that error appears in the above identified patent and that said Letters Patent is hereby corrected as shown below:

In column 6, claim 15, line 26, please delete "tier" and insert therefor --for--.

In column 6, claim 17, line 41, please delete "sisal" and insert therefor --signal--.

Signed and Sealed this

Twelfth Day of August, 1997

*Attest:*

BRUCE LEHMAN

*Attesting Officer*       *Commissioner of Patents and Trademarks*